United States Patent [19]

Hansen et al.

[11] Patent Number: 5,822,244
[45] Date of Patent: Oct. 13, 1998

[54] METHOD AND APPARATUS FOR SUSPENDING A PROGRAM/ERASE OPERATION IN A FLASH MEMORY

[75] Inventors: John Phillip Hansen; Erik Metzger, both of Austin, Tex.

[73] Assignee: Motorola, Inc., Schaumburg, Ill.

[21] Appl. No.: 936,373

[22] Filed: Sep. 24, 1997

[51] Int. Cl.[6] .................................................... G11C 11/34
[52] U.S. Cl. ................................. 365/185.11; 365/185.33
[58] Field of Search .......................... 365/185.11, 185.29, 365/185.33, 218, 229

[56] References Cited

U.S. PATENT DOCUMENTS

| | | | |
|---|---|---|---|
| 5,034,922 | 7/1991 | Burgess | 365/189.07 |
| 5,339,279 | 8/1994 | Toms et al. | 365/185.33 |
| 5,341,330 | 8/1994 | Wells et al. | 365/185.33 |
| 5,355,464 | 10/1994 | Fandrich et al. | 365/29 |
| 5,648,929 | 7/1997 | Miyamoto | 365/185.11 |
| 5,748,972 | 5/1998 | Clark et al. | 365/229 |

OTHER PUBLICATIONS

Advanced Micro Devices, Inc. 1997, "Simultaneous Read/Write Architecture", 3 pgs.

Advanced Micro Devices, Inc. 1997, Am29DL800T/Am29DL800B 8 Megabit (1 M×8–Bit/512 K×16–Bit) CMOS 3.0 Volt–only, Simultaneous Operation Flash Memory, pp. 1–38.

*Primary Examiner*—David Nelms
*Assistant Examiner*—Trong Phan
*Attorney, Agent, or Firm*—Daniel D. Hill

[57] ABSTRACT

A flash memory (12) has a plurality of banks of memory cells (20, 22). If a read operation of the flash memory (12) is required to the same bank of memory cells in which a program/erase operation is being performed, the program/erase operation is automatically suspended while the read operation is performed. Also, a wait signal is asserted by the flash memory (12) to indicate to a processor (10) that the program/erase operation is being suspended. After the program/erase operation is suspended, the wait signal is negated. If multiple read operations are requested, all the read operations are performed before the program/erase operation resumes.

30 Claims, 3 Drawing Sheets

METHOD AND APPARATUS FOR SUSPENDING A PROGRAM/ERASE OPERATION IN A FLASH MEMORY

FIELD OF THE INVENTION

The present invention relates generally to non-volatile memory and, more particularly, to a method and apparatus for suspending a program or erase operation in a flash memory.

BACKGROUND OF THE INVENTION

A flash memory is a type of non-volatile memory that includes a memory array having memory cells constructed of floating gate transistors. The floating gate transistors can be programmed, erased, or read. Flash memory is typically used in data processing system applications for storing information, such as instructions or data, that is relatively infrequently changed, and where it is desirable that the information be retained when power is removed. A well known characteristic of flash memory is that a program and/or erase operation may require significantly more time to complete than a read operation.

Generally, a flash memory has two modes of operation, a command mode and a memory read mode. The memory read mode is used for read operations from the memory array, and the command mode is for programming and/or erasing the memory cells of the memory array. Also, in the command mode, control or status registers may be read, program/erase operations may be suspended and/or resumed, and command mode may be terminated.

To perform a program/erase operation of the conventional flash memory array, command mode is entered, and a series of commands are issued by a processor to control the program/erase operation. Generally, several program or erase pulses are provided to program or erase the floating gate transistors of the memory cells. Multiple bus cycles of the data processing system may be required to perform the program/erase operation. A busy signal is asserted by the flash memory to delay other accesses to the flash memory until the current command mode operation is complete. Any subsequent read operation must wait until the command mode operation is complete before they can occur. Significant processing delays can occur in the data processing system while waiting for the flash memory to programmed or erased.

One way this problem has been reduced is to include a random access memory (RAM) in the data processing system. Portions of instructions or data are copied into system RAM so that the processor could execute from RAM while issuing commands to the flash memory. This reduces the number of read operations from the flash memory, thus reducing the delay caused by program/erase operations of the flash memory. However, this solution may increase system complexity, weight, power consumption, and cost.

Another way the problem of delayed read operations due to lengthy program/erase operations was solved was to divide the memory array into multiple arrays, or banks. While a command mode operation, such as a program/erase operation, is being performed in one of the banks, a read operation could be performed concurrently with the command mode operation in the other bank. To avoid the problem of reading and programming/erasing the same bank at the same time, a system designer would try to insure that information be stored in the flash memory in such a manner as to avoid performing program/erase operations to the same bank that is being read, thus potentially complicating system design.

If a read operation is necessary while a program/erase operation is occurring, read operation delay may be reduced by causing, in software, the program/erase operation to be suspended while the read operation is performed, and when the read operation is complete, causing the program/erase operation to be resumed. However, this solution requires a system designer to recognize when a problem is likely to occur and to add the commands necessary to both suspend and resume command mode operation when a read operation is necessary. This may be effective for reducing read operation delays because of program/erase operations, however, this solution may greatly increase the size and complexity of the program code.

Therefore, there exists a need for automatically suspending and resuming program/erase operations in a bank of flash memory when a read operation to same bank is required.

DESCRIPTION OF A PREFERRED EMBODIMENT

Generally, the present invention provides a flash memory having a plurality of banks of memory cells. If a read operation of the flash memory is requested to the same bank of memory cells in which a program/erase operation is being performed, the program/erase operation is suspended while the read operation is performed. Also, a wait signal is asserted by the flash memory to indicate to a processor that the program/erase operation is being suspended. After the read data is ready, the wait signal is negated. All subsequent read operations are performed before the program or erase operation resumes.

By automatically suspending and resuming program/erase operations of a flash memory to allow a read operation, read delays may be reduced without increasing system cost, weight, power consumption, and complexity of the data processing system. Specifically, the present invention can be more fully described with reference to FIGS. 1–6.

Figure 1:
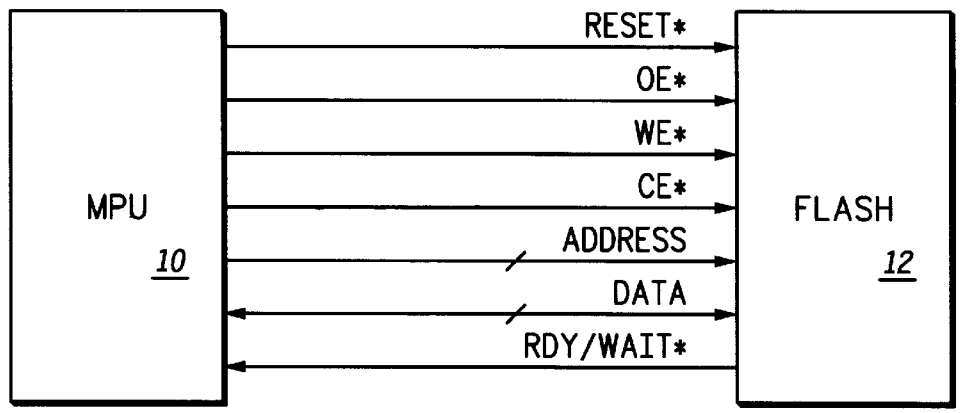
FIG. 1 illustrates, in block diagram form, a data processing system in accordance with the present invention.

FIG. 1 illustrates, in block diagram form, a data processing system in accordance with the present invention. The data processing system of FIG. 1 includes a microprocessor unit (MPU) 10 and a flash memory 12. The data processing system may additional units and/or memory that are not illustrated in FIG. 1. MPU 10 is coupled to flash memory 12 via a common address and data bus. In addition, there are is an interface between MPU 10 and flash memory 12 including various control signals to control the operations of flash memory 12. These include an output enable signal, a write enable signal, a reset signal, a chip enable signal, and a ready/wait signal. Flash memory 12 may or may not be on the same integrated circuit as MPU 10.

The present invention allows for a read operation in a flash memory having one or more banks of memory cells to occur at any time. If the read operation is to a bank that is not being programmed or erased, the read operation can occur simultaneously with the program or erase operation. If the read operation is to a bank in which a program or erase operation is occurring, the program or erase operation is automatically suspended and the read operation is performed. After the suspension is performed, the read operation is completed. Allowing read operations to occur in this manner results in reduced read latency of the flash memory.

Flash memory 12 has a memory read mode and a command mode. Generally, the memory read mode is used for read operations from an addressable location in the flash memory array. The command mode of operation is used for an access to any other memory location of the flash memory other than the memory array, such as from one of the registers (not shown) for storing control or status information, and for performing the program/erase operations of the memory array.

To enter command mode from memory read mode, a write enable signal labeled "WE*" is asserted. Note that an asterisk (*) after a signal name indicates that the signal is a logical complement of a signal having the same name, but lacking the asterisk. Flash memory 12 remains in command mode after write enable WE* is negated and until a command to terminate command mode and re-enter memory read mode is received or until output enable signal OE* is asserted. Also, command mode may be terminated after a predetermined number of write cycles have occurred, or a reset signal, labeled "RESET*" is asserted.

Figure 2:
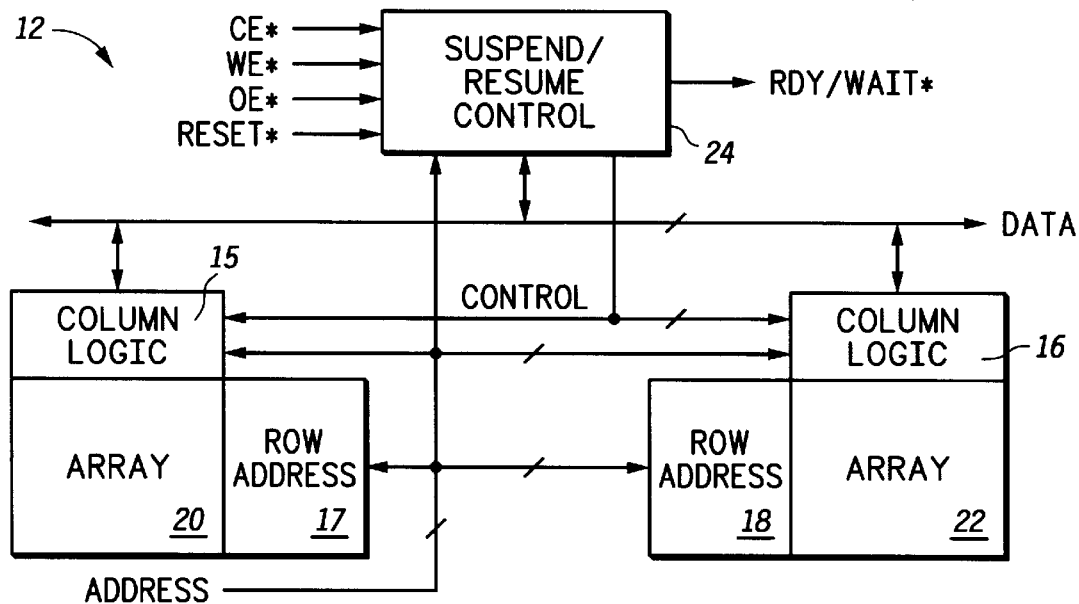
FIG. 2 illustrates, in block diagram form, the flash memory unit of FIG. 1 in greater detail.

FIG. 2 illustrates, in block diagram form, flash memory 12 in greater detail. Flash memory 12 includes memory arrays 20 and 22 and control and registers 24. Note that for purposes of illustration, flash memory 12 is shown with two banks, or arrays of memory cells. Also, for purposes of describing the invention, the words "array" and "bank" can be used interchangably. In other embodiments, flash memory 12 may have one or more banks of memory cells.

An address labeled "ADDRESS" is received by flash memory 12 from MPU 10 and provided access locations of memory arrays 20 and 22 and suspend/resume control 24. The address ADDRESS includes both row and column address signals. Row address decoder 17 and column logic 15 are coupled to memory array 20 for providing the row and column address signals to memory array 20. Row address decoder 18 and column logic 16 are coupled to memory array 22 for providing the row and column address signals to memory array 22. Suspend/resume control 24 receives a chip enable signal labeled "CE*", a write enable signal labeled "WE*", an output enable signal labeled "OE*", and a reset signal labeled "RESET*", and in response, provides a ready/wait signal labeled "RDY/WAIT*" to MPU 10. In the illustrated embodiment, a logic low RDY/WAIT* indicates that a program/erase operation of flash memory 12 is suspended for a read operation, and a logic high RDY/WAIT* indicates that flash memory 12 is available for an access by MPU 10. A bidirectional data bus receives read data, or provides write data, to the memory arrays and to control and registers 24. The read data and write data are labeled "DATA".

In flash memory 12, a read from one of arrays 20 or 22 can occur at the same time that the other array is being programmed or erased. This is known as a read while write (RWW) operation. This is an advantage because interrupt vector tables, code for performing the flash programming, interrupt service routines and other system code can exist in the flash memory at the same time that the flash memory is being updated. Prior to allowing RWW, a flash memory was expected to be either read from, or written to. Also, prior to RWW, any instruction code or data that would be required while writing to the flash would be copied into system RAM and executed therefrom to eliminate delay caused by the lengthy program and erase operations.

Figure 3:
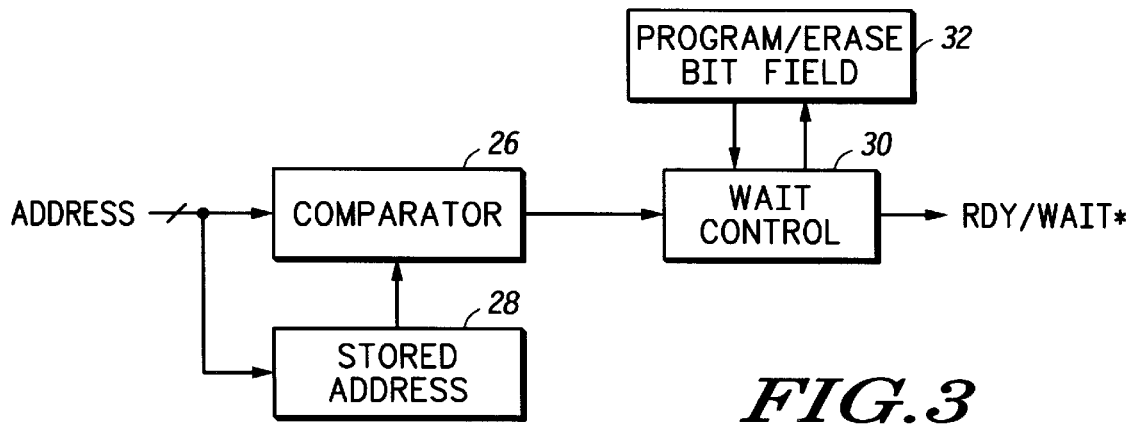
FIG. 3 illustrates, in block diagram form, a portion of the suspend/resume control of FIG. 2.

FIG. 3 illustrates, in block diagram form, a portion of suspend/resume control 24 of FIG. 2 in accordance with the present invention. The portion of suspend/resume control 24 illustrated in FIG. 3 includes comparator 26, a storage element 28 for storing an address, wait control 30, and program/erase bit field 32. Storage element 28 is for storing address information sufficient for identifying which bank, or array, of memory cells is being accessed. In the illustrated embodiment, storage element 28 stores the most significant bits of the address ADDRESS, which is used to access a specific location of one of memory banks 20 or 22. Program/erase bit field 32 is set to indicate if a current operation is a program, erase, or read operation.

An address is stored in storage element 28 via a command mode program or erase operation. Each subsequent address received by flash memory 12 is compared to the stored address in storage element 28. If a read operation is requested, and the current address is the same as the stored address in storage element 28, a match signal is provided to wait control 30. If program/erase bit field 32 indicates that a program or erase operation is occurring, then the RDY/WAIT* signal is asserted as a logic low to MPU 10, indicating that a read operation is requested to the same bank of memory cells as the program or erase operation. In accordance with the present invention, the program or erase operation is suspended while the read operation occurs. After the read operation is complete, program/erase bit field 32 is rewritten to indicate that the program/erase operation is suspended and the RDY/WAIT* signal is returned to a logic high. The program/erase operation is resumed automatically resumed based on a trigger event, such as for example, a read operation to another bank. Note that more than one read operation may occur before the program/erase operation is resumed.

If a read operation is requested, and the current address is not the same as the stored address in storage element 28, then the read operation is not to the same bank of memory cells as the stored address. If a program or erase operation is occurring in another bank, the read operation can be performed without interfering with the program or erase operation and the program or erase operation can continue without being suspended.

In another embodiment, the address signals ADDRESS may be an address used to identify an access to a unit other than flash memory 12. In response to detecting an address transition using conventional address transition detection (ATD), flash memory 12 may anticipate an access to another unit or memory (not shown), and resume the program/erase operation. In addition to resuming the program/erase operation after the read operations are complete, in another embodiment the program/erase operation may be resumed automatically after a predetermined time by including a timer in wait control 30. Also, the program/erase operation may be resumed by reentering command mode or by issuing a resume command.

Figure 4:
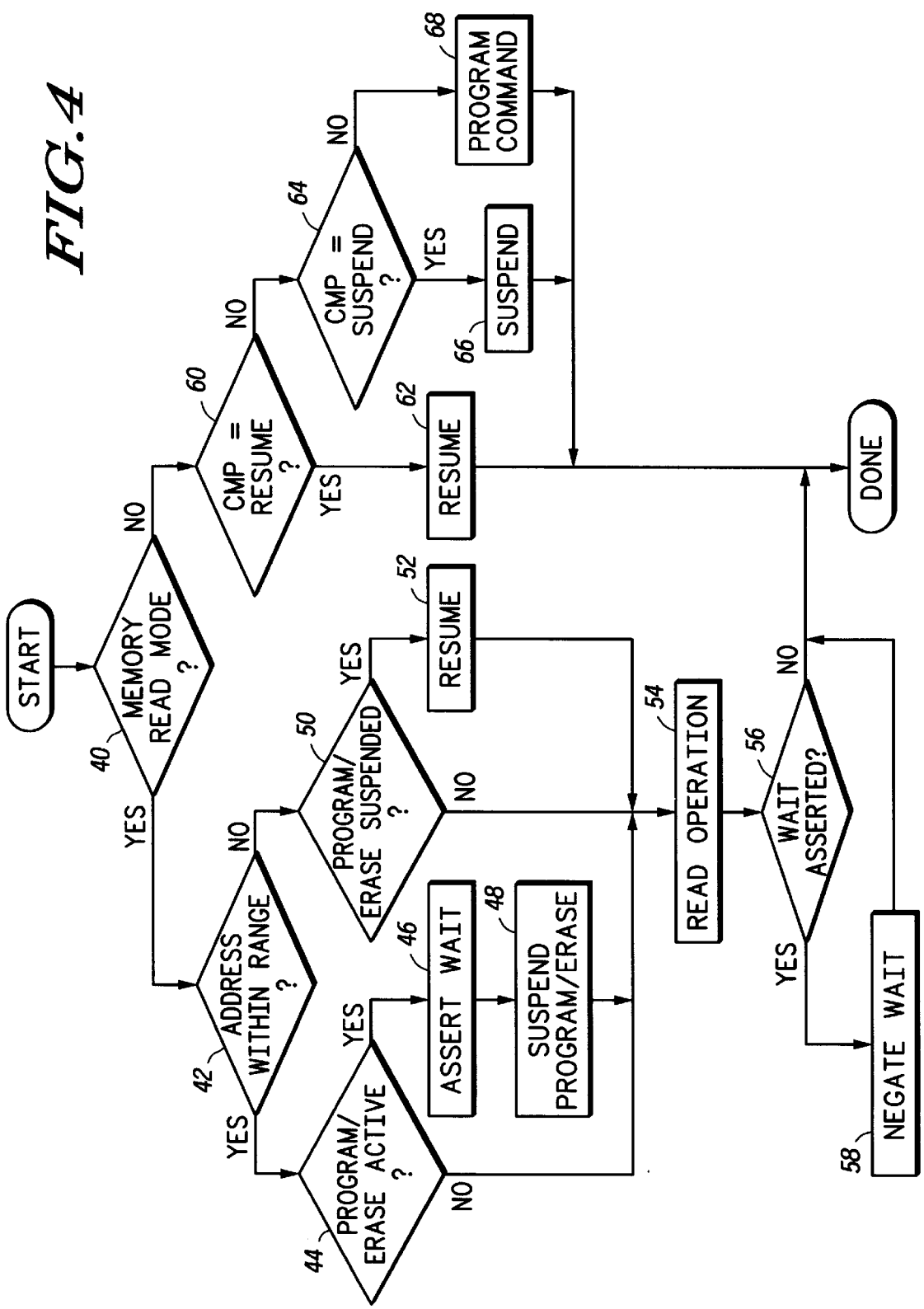
FIG. 4 illustrates a flow diagram of a suspend operation in accordance with the present invention.

FIG. 4 illustrates a flow diagram of a suspend operation of flash memory 12 in accordance with the present invention. At decision step 40, it is determined whether flash memory 12 is operating in command mode or memory read mode during an access to flash memory 12. If flash memory 12 is operating in memory read mode, the YES path is taken from decision step 40 to decision step 42. At decision step 42, it is determined if the most significant bits of ADDRESS are within a predetermined range of addresses used to define which array, or bank, of flash memory 12 (FIG. 2) is being accessed. If the most significant bits of ADDRESS are within the range of addresses, the YES path is taken to decision step 44. At decision step 44, it is determined if a program or erase operation is currently active in the bank being accessed. If a program or erase operation is currently active, the YES path is taken to step 46 and RDY/WAIT* is asserted as a logic low, and the program or erase operation is suspended, as shown in step 48, for a read operation to occur. While the program or erase operation is suspended, the read operation is performed, as shown at step 54. On the other hand, if a program or erase operation is not active in the accessed bank, the step 54 read operation can be performed without asserting RDY/WAIT* as a logic low.

Referring back to decision step 42, if the most significant bits of ADDRESS are not within the specified, or predetermined, range of addresses, the NO path is taken to decision step 50. At decision step 50, it is determined if a program or erase operation is currently suspended. If a program/erase operation is not currently suspended, then the NO path is taken to step 54, where the read operation is performed. If a program/erase operation is currently suspended, the YES path is taken to step 50, where the program or erase operation is resumed. The program or erase operation can be resumed, if previously suspended, because the requested read operation is from a different bank than the program/erase operation. At step 54, the read operation is performed.

At decision step 56, if a RDY/WAIT* was asserted as a logic low, as shown in step 46, to suspend a program/erase operation, RDY/WAIT* is negated, or returned to a logic high, to allow the read operation to complete.

Referring back to decision step 40, if flash memory 12 is operating in command mode, the NO path is taken to decision step 60. At decision step 60, it is determined if a resume command has been issued to resume a program/erase operation. If a resume command is issued, a program or erase operation is resumed. If not, at step 64, it is determined if a suspend command has been issued. If a suspend command is issued, a current program or erase operation is suspended while a read operation is performed. If a suspend command has not been issued, at step 68, a program command may be issued to program or erase flash memory 12. Commands issued in command mode may be executed in the background.

Figure 5:
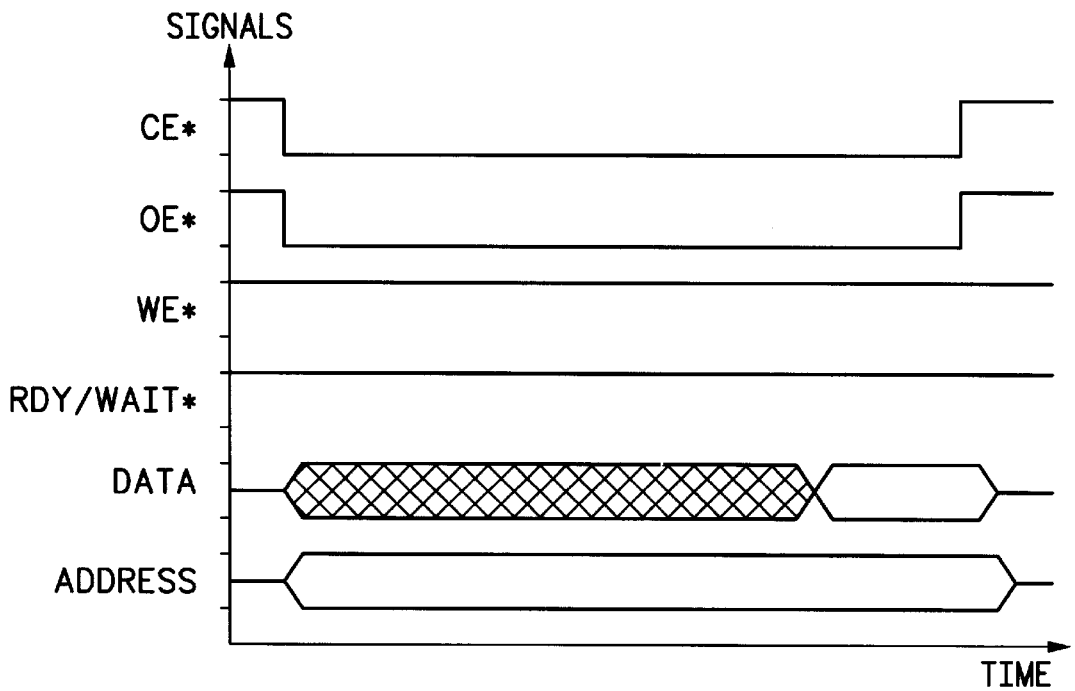
FIG. 5 illustrates, in timing diagram form, various signals of the data processing system of FIG. 1 during a normal read operation of the flash memory of FIG. 2.

FIG. 5 illustrates, in timing diagram form, various signals of the data processing system of FIG. 1 during a normal read operation of flash memory 12 of FIG. 2. During memory read mode, chip enable signal CE* and output enable signal OE* are both asserted as logic low signals. Because the access to flash memory 12 is for a read operation, write enable signal WE* remains a logic high. After CE* and OE* are asserted, DATA is treated as invalid for a certain amount of time, due in part to data bus limitations, after ADDRESS is provided by MPU 10. The location to be read is determined by ADDRESS. The ready/wait signal RDY/WAIT* remains at a logic high, indicating the either a currently active program/erase operation is to a different bank than the read operation, or that there is not program/erase operation being performed.

Figure 6:
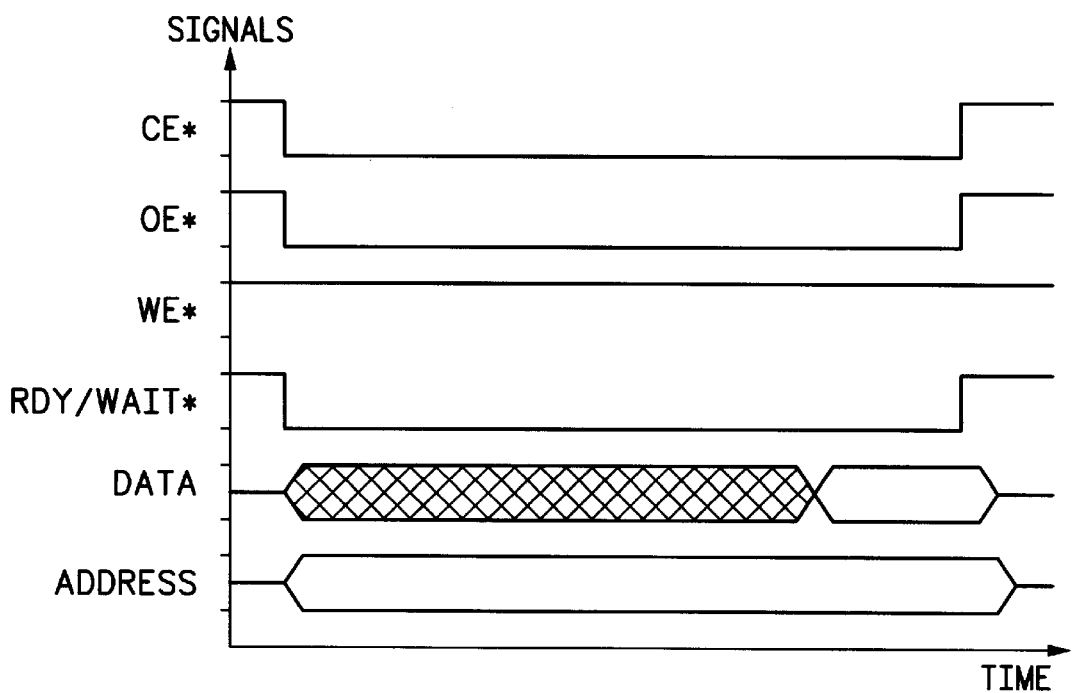
FIG. 6 illustrates, in timing diagram form, various signals of the data processing system of FIG. 1 during a read operation of the flash memory of FIG. 2 that requires a program/erase suspend operation.

FIG. 6 illustrates, in timing diagram form, various signals of the data processing system of FIG. 1 during a read operation of flash memory 12 of FIG. 2 that requires a suspend operation. In FIG. 6, a program/erase operation has been suspended to allow a read operation from the same bank in which the program/erase operation is occurring. Therefore, the various signals of FIG. 6 are the same as the signals of FIG. 5 except that the ready/wait signal RDY/WAIT* is asserted by flash memory 12 as a logic low at the beginning of the read operation to cause the currently active program/erase operation to be suspended. After the read data is ready, the ready/wait signal RDY/WAIT* is returned to a logic high allowing the read operation to complete. Note that for illustration purposes, only one read operation is illustrated. However, if necessary, multiple read operations may be performed after ready/wait signal RDY/WAIT* is returned to a logic high.

By providing the ability to automatically suspend and resume program/erase operations of a flash memory, an additional RAM used for reducing read delays may be eliminated, thus reducing system cost, weight, power consumption, and complexity. Also, interrupt service routines may be executed directly from flash memory. In addition, the ability to automatically suspend and resume program/erase operations is transparent to application software, thus increasing system flexibility and reducing the size of the system code.

While the invention has been described in the context of a preferred embodiment, it will be apparent to those skilled in the art that the present invention may be modified in numerous ways and may assume many embodiments other than that specifically set out and described above. For example, the program or erase operation of the flash memory may be replaced with a program or erase operation of another type of non-volatile memory, such as for example, of an electrically erasable programmable read-only memory (EEPROM), or an erasable programmable read-only memory (EPROM), or a one-time programmable memory (OTP). Accordingly, it is intended by the appended claims to cover all modifications of the invention which fall within the true scope of the invention.

In the claims, claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A data processing system comprising:
    a processor,
    a non-volatile memory, and
    an interface coupling the processor and the non-volatile memory comprising:
        a write enable line for providing a write enable signal,
        a chip enable line for providing a chip enable signal,
        a wait line for providing a wait signal,
        a plurality of data lines for providing a plurality of data signals, and a plurality of address lines for providing a plurality of address signals, wherein:

the wait signal is selectively asserted by the non-volatile memory when a read operation received from the processor suspends an active command as a suspended command, the wait signal is negated by the non-volatile memory after the wait signal has been asserted when the read operation is completed by the non-volatile memory.

2. The data processing system in claim 1 wherein:

the non-volatile memory comprises address comparator logic for determining whether a read address specified by the plurality of address signals is within a specified address range, and the suspended command is resumed when the read address is not within the specified address range.

3. The data processing system in claim 2 wherein:

the non-volatile memory comprises logic for programatically specifying the specified address range.

4. The data processing system in claim 1 wherein:

the non-volatile memory comprises logic for automatically determining whether the non-volatile memory will negate the wait signal when the read operation is completed.

5. A data processing system comprising:

a processor, a non-volatile memory comprising:

address comparator logic for determining whether a memory address is within a specified address range, and an interface coupling the processor to the non-volatile memory, and wherein the non-volatile memory:

suspends an active command as a suspended command when the non-volatile memory has received a read request from the processor to the non-volatile memory at a read address within the specified address range, and resumes the suspended command as the active command when the non-volatile memory has received a read request from the processor to the non-volatile memory at a read address not within the specified address range.

6. The data processing system in claim 5 wherein:

the non-volatile memory further comprises:

a suspend timer, and within the non-volatile memory:

the suspend timer is started when the active command is suspended, and the suspended command is resumed when the suspend timer exceeds a predetermined time.

7. The data processing system in claim 5 wherein:

the non-volatile memory further comprises:

control logic for identifying and processing memory commands, and the non-volatile memory suspends the active command when a suspend command is identified and processed by the control logic.

8. The data processing system in claim 5 wherein:

the non-volatile memory further comprises:

control logic for identifying and processing memory commands, and the non-volatile memory resumes the suspended command when a resume command is identified and processed by the control logic.

9. The data processing system in claim 5 wherein:

the interface comprises:

a chip enable line for providing a chip enable signal, and a plurality of address lines for providing a plurality of address signals, the non-volatile memory further comprises:

an address transition detection circuit for detecting a new address when an address specified by the address signals has changed and stabilized, and the non-volatile memory resumes the suspended command when the address transition detection circuit detects a new address and the chip enable signal is negated.

10. The data processing system in claim 5 wherein:

the interface comprises:

a write enable line for providing a write enable signal, and a chip enable line for providing a chip enable signal, and the non-volatile memory resumes the suspended command when a memory command is detected when both the chip enable signal and the write enable signal are asserted at the same time.

11. A non-volatile memory comprising:

a memory array containing a plurality of memory banks;

a control circuit for controlling read functions to and command functions for the memory array; and a memory interface comprising:

a plurality of address terminals for receiving a plurality of address signals to indicate an address, a plurality of data terminals for receiving and transmitting a plurality of data signals, and a wait terminal for transmitting a wait signal; and wherein:

the wait signal is selectively asserted by the non-volatile memory when an active command is suspended as a suspended command in response to receipt of a read operation to the address that indicates a read of a portion of the memory array being processed by the command, and the wait signal is negated by the non-volatile memory after the wait signal has been asserted when the read operation is completed by the non-volatile memory.

12. The non-volatile memory in claim 11 wherein:

the non-volatile memory further comprises an address comparator circuit for determining whether a read address specified by the plurality of address signals is within a specified address range, and the suspended command is resumed when the read address is not within the specified address range.

13. The non-volatile memory in claim 11 wherein the non-volatile memory further comprises:

a memory program circuit for programatically specifying the specified address range.

14. The non-volatile memory in claim 11 wherein the non-volatile memory further comprises:

a control circuit for automatically determining whether the non-volatile memory will negate the wait signal when the read operation is completed.

15. A non-volatile memory comprising:

a memory interface comprising:

a plurality of address terminals for receiving a plurality of address signals to indicate an operand address, and a plurality of data terminals for receiving and transmitting a plurality of data signals; and a memory array containing a plurality of memory banks,
a control circuit for controlling read functions to and command functions for the memory array,
an address comparator circuit for determining whether a memory address is within a specified address range, and
wherein the non-volatile memory:
suspends an active command as a suspended command when the non-volatile memory has received a read request for the memory array at a read address within the specified address range, and
resumes the suspended command as the active command when the non-volatile memory has received a read request for the non-volatile memory located at a read address not within the specified address range.

16. The non-volatile memory in claim 15 wherein:
the non-volatile memory further comprises:
a suspend timer, and
within the non-volatile memory:
the suspend timer is started when the active command is suspended, and
the suspended command is resumed when the suspend timer exceeds a predetermined time.

17. The non-volatile memory in claim 15 wherein:
the non-volatile memory further comprises:
a control logic for identifying and processing memory commands, and
the non-volatile memory suspends the active command when a suspend command is identified and processed by the control logic.

18. The non-volatile memory in claim 15 wherein:
the non-volatile memory further comprises:
a control circuit for identifying and processing memory commands, and
the non-volatile memory resumes the suspended command when a resume command is identified and processed by the control circuit.

19. The non-volatile memory in claim 15 wherein:
the memory interface further comprises:
a chip enable terminal for receiving a chip enable signal, and
a plurality of address terminals for receiving a corresponding plurality of address signals,
the non-volatile memory further comprises:
an address transition detection circuit for detecting a new address when an address specified by the corresponding plurality of address signals has changed and stabilized; and
the non-volatile memory resumes the suspended command when the address transition detection circuit detects a new address and the chip enable signal is negated.

20. The non-volatile memory in claim 15 wherein:
the memory interface further comprises:
a write enable terminal for receiving a write enable signal, and
a chip enable terminal for receiving a chip enable signal, and
the non-volatile memory resumes the suspended command when a memory command is detected when both the chip enable signal and the write enable signal are asserted at the same time.

21. A method of performing a non-volatile memory read operation in a non-volatile memory array in response to signals from a processor over an interface between the non-volatile memory and the processor having:
a wait signal,
a plurality of data signals, and
a plurality of address signals,
said method comprising:
A) detecting a memory read request from the processor for a read address specified to the non-volatile memory array,
B) checking to determine whether the non-volatile memory array has an active command if a memory read request is detected in step (A),
C) asserting the wait signal if the non-volatile memory array has been determined to have the active command in step (B),
D) suspending the active command as a suspended command if the non-volatile memory array has been determined to have the active command in step (B),
E) waiting until any active command is suspended in step (D),
F) reading data from the non-volatile memory array at the read address and transmitting the data to the processor as the plurality of data signals after the waiting in step (E) is complete, and
G) negating the wait signal if asserted in step (C) after the waiting in step (E) is complete.

22. The method in claim 21 wherein:
suspending the active command in step (D) is after the wait signal is asserted in step (C).

23. The method in claim 21 which further comprises:
H) determining whether the read address is within a specified range for a read request detected in step (A); and
I) resuming the suspended command if the read address is not determined to be within the specified range in step (H).

24. The method in claim 21 which further comprises:
H) determining whether the read address is within a specified range for a read request detected in step (A); and
wherein:
the active command is only suspended in step (D) if the read address is within the specified range.

25. A method of performing a non-volatile memory read operation in a non-volatile memory array in response to signals from a processor over an interface between the non-volatile memory and the processor having:
a plurality of data signals, and
a plurality of address signals,
said method comprising:
A) detecting a read request from the processor at a read address specified to the non-volatile memory array;
B) determining whether the read address is within a specified range for a read request detected in step (A);
C) determining whether the non-volatile memory array has an active command if a read request is detected in step (A);
D) suspending the active command as a suspended command if the non-volatile memory array was determined to have the active command in step (B);
E) reading data from the non-volatile memory array and transmitting the data to the processor as the plurality of data signals; and
F) resuming the suspended command if the read address is not determined to be within the specified range in step (B).

26. The method in claim 25 which further comprises:

G) starting a suspend timer after the active command is suspended, and

H) resuming the suspended command after the suspend timer exceeds a predetermined time.

27. The method in claim 25 which further comprises:

G) detecting a memory command;

H) determining whether the memory command is a suspend command; and

I) suspending the active command as the suspended command if the memory command is the suspend command.

28. The method in claim 25 which further comprises:

G) detecting a memory command;

H) determining whether the memory command is a resume command; and

I) resuming the suspended command if the memory command is the resume command.

29. The method in claim 25 wherein:

the interface additionally having:

a chip enable signal, and which further comprises:

G) monitoring the plurality of address signals to detect a new address;

H) testing the chip enable signal to determine whether the new address is intended for the non-volatile memory or for an other unit; and I) resuming the suspended command when the new address is intended for the other unit and the new address has been detected.

30. The method in claim 25 wherein:

the interface additionally having:

an write enable signal, and which further comprises:

G) testing the write enable signal to determine whether a memory request is the read request or a memory command; and H) resuming the suspended command when the memory request is determined to be the memory command.

* * * * *